(12) United States Patent
Song et al.

(10) Patent No.: US 12,507,403 B2
(45) Date of Patent: Dec. 23, 2025

(54) SEMICONDUCTOR STRUCTURE AND METHOD FOR MANUFACTURING SAME

(71) Applicant: CHANGXIN MEMORY TECHNOLOGIES, INC., Hefei (CN)

(72) Inventors: Zhihao Song, Hefei (CN); Zhonghua Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 565 days.

(21) Appl. No.: 17/804,591

(22) Filed: May 30, 2022

(65) Prior Publication Data

US 2023/0320082 A1 Oct. 5, 2023

Related U.S. Application Data

(63) Continuation of application No. PCT/CN2022/082200, filed on Mar. 22, 2022.

(30) Foreign Application Priority Data

Mar. 11, 2022 (CN) .......................... 202210237831.5

(51) Int. Cl.
H10B 12/00 (2023.01)
(52) U.S. Cl.
CPC ............. *H10B 12/50* (2023.02); *H10B 12/03* (2023.02); *H10B 12/09* (2023.02); *H10B 12/30* (2023.02)
(58) Field of Classification Search
CPC ............................. H10B 12/09; H10B 12/033
See application file for complete search history.

(56) References Cited

U.S. PATENT DOCUMENTS

| | | | |
|---|---|---|---|
| 6,078,088 A | 6/2000 | Buynoski | |
| 6,303,977 B1 | 10/2001 | Schroen | |
| 6,391,707 B1* | 5/2002 | Dirnecker | H10D 1/692 |
| | | | 257/E21.018 |
| 7,253,531 B1 | 8/2007 | Huang | |
| 7,646,087 B2 | 1/2010 | Tu | |
| 2006/0244156 A1 | 11/2006 | Cheng | |
| 2008/0001296 A1* | 1/2008 | Tu | H01L 23/525 |
| | | | 257/784 |
| 2010/0219502 A1* | 9/2010 | Shieh | H01L 24/06 |
| | | | 257/532 |

(Continued)

FOREIGN PATENT DOCUMENTS

CN 1855468 A 11/2006
CN 101388385 A 3/2009

(Continued)

OTHER PUBLICATIONS

Supplementary European Search Report in the European application No. 22782654.2, mailed on Nov. 9, 2023. 7 pages.

(Continued)

*Primary Examiner* — Edward Chin
(74) *Attorney, Agent, or Firm* — Syncoda LLC; Feng Ma

(57) ABSTRACT

A semiconductor structure includes: a substrate; a first dielectric layer, located on the substrate; and a pad structure, located on the first dielectric layer. The first dielectric layer has at least one support layer. The pad structure is located above the support layer. A material strength of the support layer is greater than a material strength of the first dielectric layer.

15 Claims, 9 Drawing Sheets

(56) References Cited

U.S. PATENT DOCUMENTS

2013/0007593 A1    1/2013  Ichimi

FOREIGN PATENT DOCUMENTS

| | | | | | |
|---|---|---|---|---|---|
| CN | 107301976 | A | | 10/2017 | |
| CN | 110504284 | A | | 11/2019 | |
| CN | 111244065 | A | | 6/2020 | |
| CN | 114429958 | A | * | 5/2022 | ............ H10B 12/30 |
| TW | 484196 | B | | 4/2002 | |
| TW | 574740 | B | | 2/2004 | |
| TW | 200629508 | A | | 8/2006 | |
| TW | 201308542 | A | | 2/2013 | |

OTHER PUBLICATIONS

First Office Action of the Taiwanese application No. 111130288, issued on Mar. 28, 2023.
International Search Report in the international application No. PCT/CN2022/082200, mailed on Nov. 28, 2022.

* cited by examiner

SEMICONDUCTOR STRUCTURE AND METHOD FOR MANUFACTURING SAME

CROSS-REFERENCE TO RELATED APPLICATIONS

The present application is a U.S. continuation application of International Application No. PCT/CN2022/082200 filed on Mar. 22, 2022, which claims priority to Chinese Patent Application No. 202210237831.5 filed on Mar. 11, 2022. These applications are hereby incorporated by reference in their entirety.

BACKGROUND

A semiconductor structure includes a substrate and a pad structure located on the substrate. The pad structure is separated from the substrate by a dielectric layer.

There is usually a relatively large vertical distance between the pad structure and the substrate, and there is a relatively large thickness of the dielectric layer under the pad structure, easily resulting in poor stability of the semiconductor structure. In addition, the dielectric layer under the pad structure is easily damaged by stress generated when the semiconductor structure is bonded with other structures by using the pad structure, thereby reducing the performance of the semiconductor structure.

SUMMARY

The disclosure relates to the field of semiconductor manufacturing, and in particular, to a semiconductor structure and a method for manufacturing the same.

Embodiments of the disclosure provide a semiconductor structure. The semiconductor structure includes a substrate, a first dielectric layer, and a pad structure.

The first dielectric layer is located on the substrate.

The pad structure is located on the first dielectric layer.

The first dielectric layer has at least one support layer. The pad structure is located above the support layer. A material strength of the support layer is greater than a material strength of the first dielectric layer.

Embodiments of the disclosure further provide a method for manufacturing a semiconductor structure. The method includes the following operations.

A substrate is provided.

A first dielectric layer and at least one support layer located on the first dielectric layer are formed on the substrate. A material strength of the support layer is greater than a material strength of the first dielectric layer.

A pad structure is formed on the first dielectric layer. The pad structure is located above the support layer.

BRIEF DESCRIPTION OF THE DRAWINGS

In order to more clearly illustrate the technical solutions in the embodiments of the disclosure, the drawings used in the technical description of the embodiments will be briefly described below. It is apparent that the drawings in the following descriptions are merely some embodiments of the disclosure. Other drawings can be obtained from those skilled in the art according to these drawings without any creative work.

DETAILED DESCRIPTION

Figure 1:
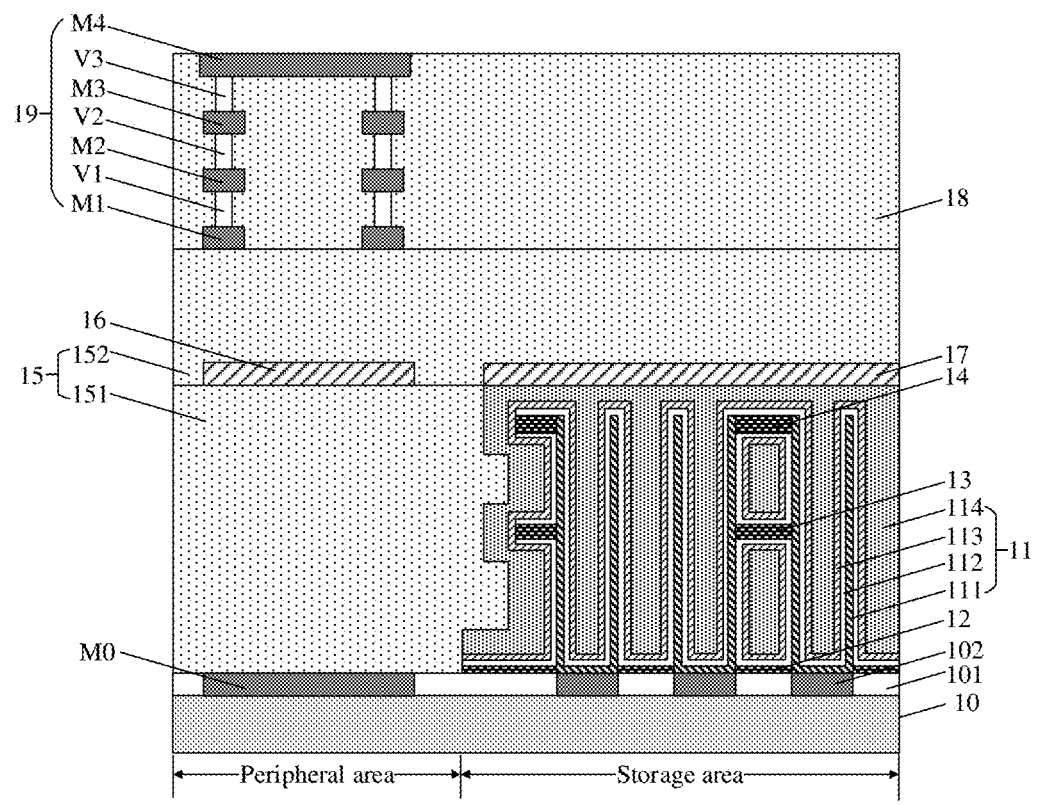
FIG. 1 is a schematic diagram of a semiconductor structure according to an embodiment of the disclosure.

Exemplary embodiments disclosed in the disclosure are described in more detail with reference to drawings. Although the exemplary embodiments of the disclosure are shown in the drawings, it should be understood that the disclosure may be implemented in various forms and should not be limited by the specific embodiments described here. On the contrary, these embodiments are provided for more thorough understanding of the disclosure, and to fully convey a scope disclosed in the embodiments of the disclosure to a person skilled in the art.

In the following descriptions, a lot of specific details are given in order to provide the more thorough understanding of the disclosure. However, it is apparent to a person skilled in the art that the disclosure may be implemented without one or more of these details. In other examples, in order to avoid confusion with the disclosure, some technical features well-known in the field are not described. Namely, all the features of the actual embodiments are not described here, and well-known functions and structures are not described in detail.

In the drawings, the sizes of a layer, a region, and an element and their relative sizes may be exaggerated for clarity. The same reference numeral represents the same element throughout.

It should be understood that while the element or the layer is referred to as being "on", "adjacent to", "connected to" or "coupled to" other elements or layers, it may be directly on the other elements or layers, adjacent to, connected or coupled to the other elements or layers, or an intermediate element or layer may be existent. In contrast, while the element is referred to as being "directly on", "directly adjacent to", "directly connected to" or "directly coupled to" other elements or layers, the intermediate element or layer is not existent. It should be understood that although terms first, second, third and the like may be used to describe various elements, components, regions, layers and/or sections, these elements, components, regions, layers and/or sections should not be limited by these terms. These terms are only used to distinguish one element, component, region, layer or section from another element, component, region, layer or section. Therefore, without departing from the teaching of the disclosure, a first element, component, region, layer or section discussed below may be represented as a second element, component, region, layer or section. While the second element, component, region, layer or section is discussed, it does not mean that the first element, component, region, layer or section is necessarily existent in the disclosure.

Spatial relation terms, such as "under", "below", "lower", "underneath", "above", "upper" and the like, may be used here for conveniently describing so that a relationship between one element or feature shown in the drawings and other elements or features is described. It should be understood that in addition to orientations shown in the drawings, the spatial relationship terms are intended to further include the different orientations of a device in use and operation. For example, if the device in the drawings is turned over, then the elements or the features described as "below" or "underneath" or "under" other elements may be oriented "on" the other elements or features. Therefore, the exemplary terms "below" and "under" may include two orientations of up and down. The device may be otherwise oriented (rotated by 90 degrees or other orientations) and the spatial descriptions used here are interpreted accordingly.

A purpose of the terms used here is only to describe the specific embodiments and not as limitation to the disclosure. While used here, singular forms of "a", "an" and "said/the" are also intended to include plural forms, unless the context clearly indicates another mode. It should also be understood that terms "comprising" and/or "including", while used in the description, determine the existence of the described features, integers, steps, operations, elements and/or components, but do not exclude the existence or addition of one or more other features, integers, steps, operations, elements, components, and/or groups. As used herein, a term "and/or" includes any and all combinations of related items listed.

A semiconductor structure includes a substrate and a pad structure located on the substrate. The pad structure is separated from the substrate by a dielectric layer. The semiconductor structure is bonded with other structures by using the pad structure.

However, in some implementations, there is usually a relatively large vertical distance between the pad structure and the substrate, and there is a relatively large thickness of the dielectric layer under the pad structure, easily resulting in poor stability of the semiconductor structure. In addition, when the dielectric layer having a large thickness is formed, it is difficult to perform a planarization process on the dielectric layer, resulting in poor flatness of a surface of the dielectric layer. In addition, the dielectric layer under the pad structure is easily damaged by stress generated when the semiconductor structure is bonded with other structures by using the pad structure, thereby reducing the performance of the semiconductor structure.

Based on this, the following technical solutions of the embodiments of the disclosure are provided.

Embodiments of the disclosure provide a semiconductor structure. The semiconductor structure includes: a substrate; a first dielectric layer, located on the substrate; and a pad structure, located on the first dielectric layer. The first dielectric layer has at least one support layer. The pad structure is located above the support layer. A material strength of the support layer is greater than a material strength of the first dielectric layer.

The semiconductor structure provided in the embodiments of the disclosure includes the support layer located under the pad structure. The material of the support layer has a larger strength relative to the material of the first dielectric layer. Therefore, the support layer can enhance the stability of the semiconductor structure. In addition, the support layer can relieve the stress generated during bonding, so that damages of the stress to the first dielectric layer can be reduced or eliminated. Therefore, the performance of the semiconductor structure can be improved.

The semiconductor structure provided in this embodiment of the disclosure may be a Dynamic Random Access Memory (DRAM, but it is not limited thereto. The semiconductor structure may alternatively be other semiconductor structures.

Specific implementations of the disclosure are described below in detail with reference to the drawings. While the embodiments of the disclosure are described in detail, for ease of descriptions, a schematic diagram may not be partially enlarged according to a general scale, and the schematic diagram is only an example, it should not limit a scope of protection of the disclosure herein.

Figure 2:
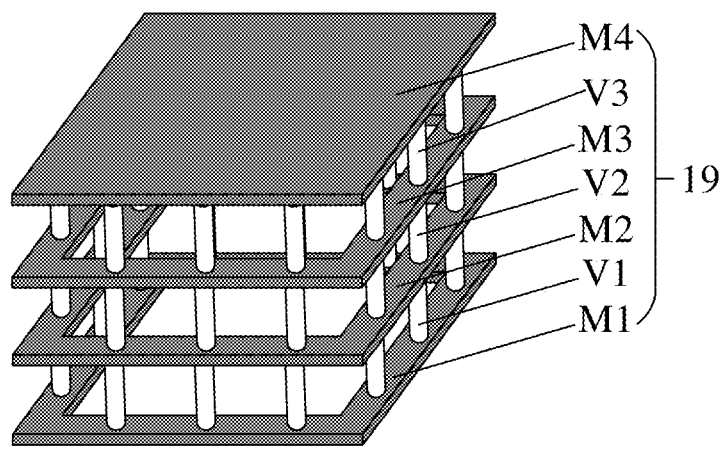
FIG. 2 is a schematic three-dimensional diagram of a pad structure shown in FIG. 1.

FIG. 1 is a schematic diagram of a semiconductor structure according to an embodiment of the disclosure. FIG. 2 is a schematic three-dimensional diagram of a pad structure shown in FIG. 1. The semiconductor structure provided in the embodiments of the disclosure is further described in detail below with reference to FIG. 1 and FIG. 2.

As shown in the figures, the semiconductor structure includes: a substrate 10; a first dielectric layer 15, located on the substrate 10; and a pad structure 19, located on the first dielectric layer 15. The first dielectric layer 15 has at least one support layer 16. The pad structure 19 is located above the support layer 16. A material strength of the support layer 16 is greater than a material strength of the first dielectric layer 15.

The substrate may be a semiconductor substrate, and may include at least one elementary semiconductor material (for example, a silicon (Si) substrate, or a germanium (Ge) substrate), at least one III-V compound semiconductor material, at least one II-VI compound semiconductor material, at least one aorganic semiconductor material, or other semiconductor materials known in the art. In some embodiments, the substrate may have structures such as a word line, a bit line, an active area, an isolation structure, and a contact layer. In a specific embodiment, the substrate is the Si substrate. The Si substrate may or may not be doped.

In an embodiment, the substrate 10 includes a storage area and a peripheral area. In some embodiments, the substrate 10 further includes a bottom metal layer M0 arranged on a surface of the substrate 10, multiple connection pads 102, and an insulation layer 101 located between the bottom metal layer M0 and the multiple connection pads 102. The bottom metal layer M0 is located at the peripheral area. The multiple connection pads 102 are located at the storage area. The bottom metal layer M0 may be electrically connected to some structures in the substrate 10. Materials of the bottom metal layer M0 and the connection pads 102 include at least one of tungsten (W), copper (Cu), titanium (Ti), tantalum (Ta), titanium nitride (TiN), tantalum nitride (TaN), metal silicides, or metal alloys. The insulation layer 101 may be made of a nitride, such as silicon nitride.

In an embodiment, the first dielectric layer 15 includes a first sub-layer 151 and a second sub-layer 152 located on the first sub-layer 151. The support layer 16 is formed between the first sub-layer 151 and the second sub-layer 152. As shown in FIG. 1, the second sub-layer 152 covers the first sub-layer 151 and the support layer 16. A material of the first sub-layer 151 and a material of the second sub-layer 152 include an oxide. In some embodiments, the material of the first sub-layer 151 is the same as the material of the second sub-layer 152, for example, the material is silicon oxide, but is not limited thereto. The material of the first sub-layer 151 may be different from the material of the second sub-layer 152.

In an actual process, a manner of forming the first dielectric layer 15 and the support layer 16 may be: forming the first sub-layer 151 on the substrate 10; next, forming the support layer 16 on the first sub-layer 151; and then forming the second sub-layer 152 on the first sub-layer 151 and the support layer 16. More specifically, the first sub-layer 151 and the second sub-layer 152 may be formed by processes such as Atomic Layer Deposition (ALD) and Chemical Vapor Deposition (CVD). Optionally, a planarization process, such as Chemical Mechanical Polishing (CMP) and/or etching may alternatively be used to planarize upper surfaces of the first sub-layer 151 and the second sub-layer 152. In the embodiments of the disclosure, when forming the first dielectric layer 15 having a large thickness, the first sub-layer 151 is formed, and then the second sub-layer 152 is formed. The thicknesses of the first sub-layer 151 and the second sub-layer 152 are relatively thin. Compared with some implementations, the difficulty of performing the planarization process on the first sub-layer 151 and the second sub-layer 152 is reduced, and the flatness of the surfaces of the first sub-layer 151 and the second sub-layer 152 is increased.

It is to be noted that, the number of the support layers 16 is not limited in FIG. 1. There may be more support layers 16, such as 2, 3, or 4. The support layers 16 are longitudinally distributed in the first dielectric layer 15, and are located under the pad structure 19. At least one support layer 16 is arranged under the pad structure 19, so that the stability of the semiconductor structure can be enhanced, and stress caused by bonding can be relieved. It is to be understood that, the more support layers 16, the better support effect and stress-relieving effect can be achieved. However, an excess of layers would increase the complexity of the process, so that the number of the support layers 16 should not be too many. A material of the support layer 16 includes at least one of silicon germanium, polysilicon, tungsten, titanium, tantalum, tungsten nitride, titanium nitride, or tantalum nitride, is not limited thereto. Any material of which material strength conforms to the above requirements may be used as the support layer 16 in the embodiments of the disclosure.

In an embodiment, the support layer 16 is plate-shaped. Projections of the pad structure 19 and the support layer 16 are overlapped in a direction perpendicular to the substrate 10, but are not limited thereto. The projection of the pad structure 19 in the direction perpendicular to the substrate 10 may alternatively fall into the projection of the support layer 16 in the direction perpendicular to the substrate 10.

In an embodiment, all the first dielectric layer 15, the support layer 16, and the pad structure 19 are located above the peripheral area. In some embodiments, the semiconductor structure further includes: a capacitor structure 11, located above the storage area; and a capacitor covering layer 17, covering an upper surface of the capacitor structure 11.

Specifically, the capacitor structure 11 includes: multiple discrete lower electrode layers 111, located on the substrate 10, the multiple lower electrode layers 111 have cylindrical structures and are correspondingly connected to the multiple connection pads 102 one to one; a capacitor dielectric layer 112, at least covering surfaces of the lower electrode layers 111; an upper electrode layer 113, covering a surface of the capacitor dielectric layer 112; and an upper electrode filling layer 114, located on the upper electrode layer 113 and among the multiple discrete lower electrode layers 111. In an embodiment, the capacitor structure 11 is formed before the first dielectric layer 15 is formed.

As shown in FIG. 1, the capacitor covering layer 17 covers an upper surface of the upper electrode filling layer 114. In an embodiment, the material of the support layer 16 is same as the material of the capacitor covering layer 17. In a specific embodiment, the support layer 16 and the capacitor covering layer 17 are formed in a same process step. The second sub-layer 152 also covers the capacitor covering layer 17. In case there are multiple support layers 16, at least one support layer 16 and the capacitor covering layer 17 are formed in the same process step. Therefore, a process for manufacturing a semiconductor structure can be simplified.

In an embodiment, the semiconductor structure further includes a bottom support layer 12, an intermediate support layer 13, and a top support layer 14 that are successively formed above the peripheral area from bottom to top. The lower electrode layers 111 are arranged in the bottom support layer 12, the intermediate support layer 13, and the top support layer 14. The bottom support layer 12, the intermediate support layer 13, and the top support layer 14 are configured to support the lower electrode layers 111.

Figure 3:
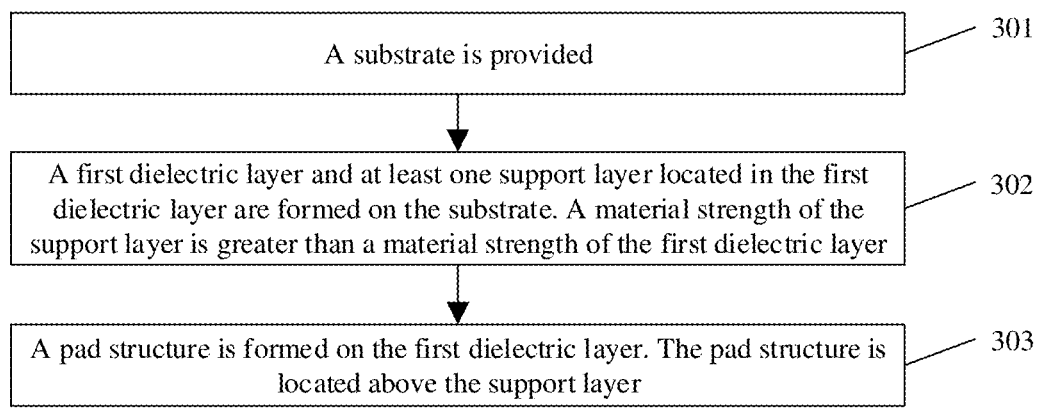
FIG. 3 is a block flowchart of a method for manufacturing a semiconductor structure according to an embodiment of the disclosure.

As shown in FIG. 2 and FIG. 3, in an embodiment, the pad structure 19 includes a top metal layer M4, and the top metal layer M4 is plate-shaped. In some embodiments, the pad structure 19 further includes at least one intermediate metal layer M1, M2, or M3 located under the top metal layer M4, and conductive plugs V1, V2, and V3 electrically connecting the at least one intermediate metal layer M1, M2, or M3 and the top metal layer M4 in sequence. The intermediate metal layer M1, M2, or M3 is in an annular shape.

Materials of the top metal layer, the intermediate metal layer, and the conductive plug include at least one of tungsten (W), copper (Cu), titanium (Ti), tantalum (Ta), titanium nitride (TiN), tantalum nitride (TaN), metal silicides, or metal alloys.

It is to be noted that, the number of the intermediate metal layers is not limited in FIG. 1 and FIG. 2. There may be more or less intermediate metal layers, such as 1, 2, or 4. The number of the conductive plugs between two adjacent metal layers is not limited in FIG. 2. There may be more or less conductive plugs.

In an embodiment, the semiconductor structure further includes a second dielectric layer 18 located on the first dielectric layer 15. The pad structure 19 is located in the second dielectric layer 18. An upper surface of the top metal layer M4 is exposed outside the second dielectric layer 18. In some embodiments, the second dielectric layer 18 is not a single layer structure, and is formed by multiple layers of insulation materials in multiple process steps.

A vertical distance between the pad structure 19, especially the top metal layer M4, and the substrate 10 is relatively large. In some embodiments, the semiconductor structure further includes a capacitor structure 11 having a large height, so that the vertical distance between the pad structure 19 and the substrate 10 is further increased. The semiconductor structure provided in the embodiments of the disclosure includes the support layer 16 located under the pad structure 19. The material of the support layer 16 has a larger strength relative to the material of the first dielectric layer 15. Therefore, the support layer 16 can enhance the stability of the semiconductor structure. In addition, the support layer 16 can relieve the stress generated during bonding, so that damages of the stress to the first dielectric layer 15 can be reduced or eliminated. Therefore, the performance of the semiconductor structure can be improved.

Embodiments of the disclosure further provide a method for manufacturing a semiconductor structure. As shown in FIG. 3, the method includes the following operations.

At S301, a substrate is provided.

At S302, a first dielectric layer and at least one support layer located in the first dielectric layer are formed on the substrate. A material strength of the support layer is greater than a material strength of the first dielectric layer.

At S303, a pad structure is formed on the first dielectric layer. The pad structure is located above the support layer.

The method for manufacturing a semiconductor structure provided in the embodiments of the disclosure is further described in detail below with reference to FIG. 4 to FIG. 9.

Figure 4:
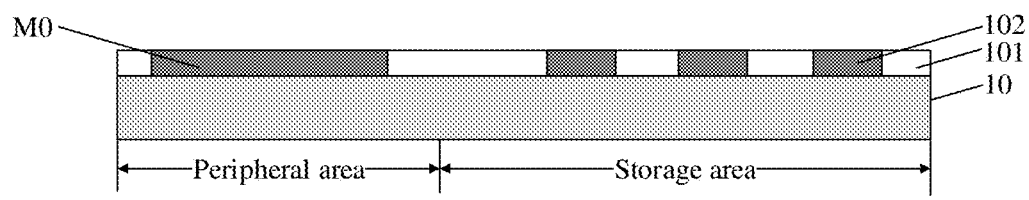
FIG. 4 is a process flow diagram of a semiconductor structure according to embodiments of the disclosure.

First, S301 is performed, as shown in FIG. 4. The substrate 10 is provided.

The substrate may be a semiconductor substrate, and may include at least one elementary semiconductor material (for example, a silicon (Si) substrate, or a germanium (Ge) substrate), at least one III-V compound semiconductor material, at least one II-VI compound semiconductor material, at least one of an organic semiconductor material, or other semiconductor materials known in the art. In some embodiments, the substrate may have structures such as a word line, a bit line, an active area, an isolation structure, and a contact layer. In a specific embodiment, the substrate is the Si substrate. The Si substrate may or may not be doped.

In an embodiment, the substrate 10 includes a storage area and a peripheral area. In some embodiments, the substrate 10 further includes, on a surface of substrate 10, a bottom metal layer M0, multiple connection pads 102, and an insulation layer 101 located between the bottom metal layer M0 and the multiple connection pads 102. The bottom metal layer M0 is located at the peripheral area. The multiple connection pads 102 are located at the storage area. The bottom metal layer M0 may be electrically connected to some structures in the substrate 10. Materials of the bottom metal layer M0 and the connection pads 102 include at least one of tungsten (W), copper (Cu), titanium (Ti), tantalum (Ta), titanium nitride (TiN), tantalum nitride (TaN), metal silicides, or metal alloys. The insulation layer 101 may be made of a nitride, such as silicon nitride.

Figure 5:
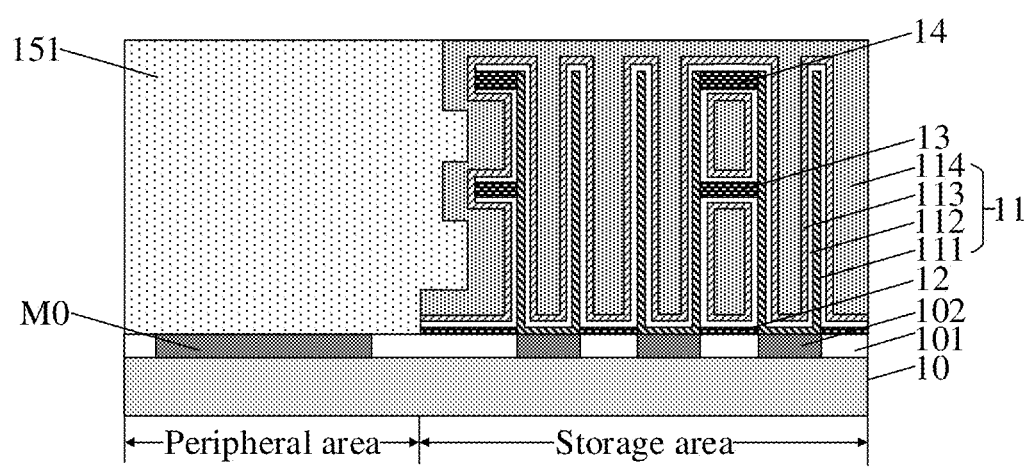
FIG. 5 is a process flow diagram of a semiconductor structure according to embodiments of the disclosure.
Figure 6:
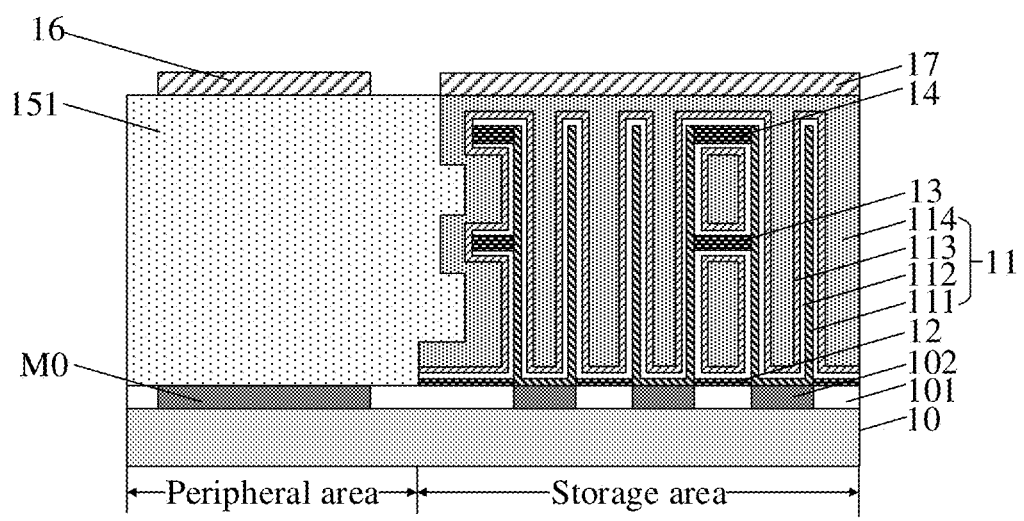
FIG. 6 is a process flow diagram of a semiconductor structure according to embodiments of the disclosure.
Figure 7:
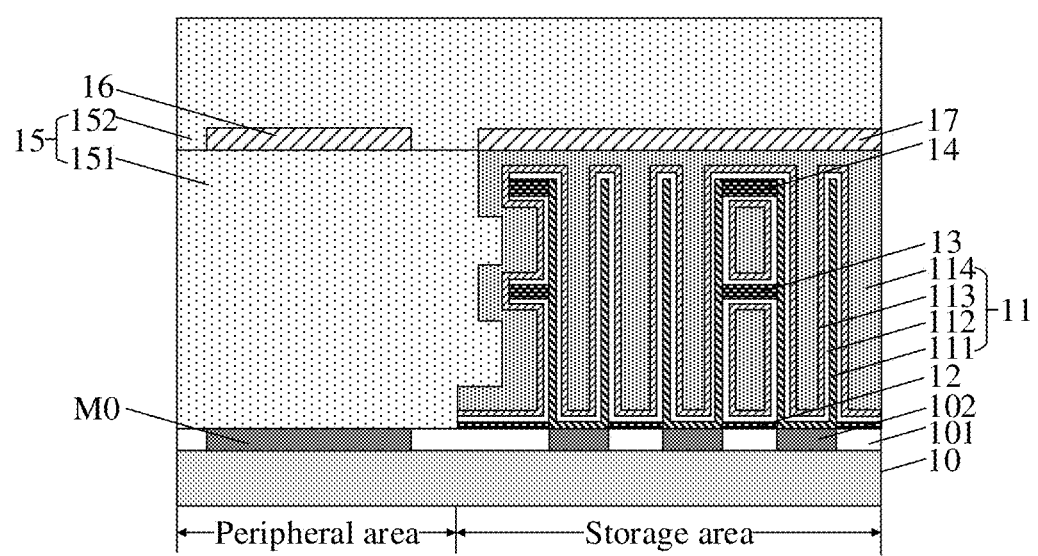
FIG. 7 is a process flow diagram of a semiconductor structure according to embodiments of the disclosure.

Next, S302 is performed, as shown in FIG. 5 to FIG. 7. A first dielectric layer 15 and at least one support layer 16 located in the first dielectric layer 15 are formed on the substrate 10. A material strength of the support layer 16 is greater than a material strength of the first dielectric layer 15.

Specifically, the first dielectric layer 15 includes a first sub-layer 151 and a second sub-layer 152. The operation that the first dielectric layer 15 and the support layer 16 are formed on the substrate 10 includes the following sub-operations.

The first sub-layer 151 is formed on the substrate 10, as shown in FIG. 5.

The support layer 16 is formed on the first sub-layer 151, as shown in FIG. 6.

The second sub-layer 152 is formed, and covers the support layer 16 and the first sub-layer 151, as shown in FIG. 7.

More specifically, the first sub-layer 151 and the second sub-layer 152 may be formed by processes such as Atomic Layer Deposition (ALD) and Chemical Vapor Deposition (CVD). Optionally, a planarization process, such as Chemical Mechanical Polishing (CMP) and/or etching may alternatively be used to planarize upper surfaces of the first sub-layer 151 and the second sub-layer 152. In the embodiments of the disclosure, when the first dielectric layer 15 having a large thickness is formed, the first sub-layer 151 is formed, and then the second sub-layer 152 is formed. The thicknesses of the first sub-layer 151 and the second sub-layer 152 are relatively thin. Compared with some implementations, the difficulty of performing the planarization process on the first sub-layer 151 and the second sub-layer 152 is reduced, and the flatness of the surfaces of the first sub-layer 151 and the second sub-layer 152 is increased. A material of the first sub-layer 151 and a material of the second sub-layer 152 include an oxide. In some embodiments, the material of the first sub-layer 151 is the same as the material of the second sub-layer 152, for example, the material is silicon oxide, but is not limited thereto. The material of the first sub-layer 151 may be different from the material of the second sub-layer 152.

In some embodiments, the support layer 16 is plate-shaped. It is to be noted that, the number of the support layers 16 is not limited in FIG. 6 and FIG. 7. There may be more support layers 16, such as 2, 3, or 4, formed in the first dielectric layer 15. The support layers 16 are longitudinally distributed in the first dielectric layer 15. The support layer(s) 16 can enhance the stability of the semiconductor structure and relieve the stress caused by bonding. It is to be understood that, the more support layers 16, the better support effect and a stress-relieving effect can be achieved. However, an excess of layers would increase the complexity of the process, so that the number of the support layers 16 should not be too many. A material of the support layer 16 includes at least one of silicon germanium, polysilicon, tungsten, titanium, tantalum, tungsten nitride, titanium nitride, or tantalum nitride, but is not limited thereto. Any material of which material strength conforms to the above requirements may be used as the support layer 16 in the embodiments of the disclosure.

In an embodiment, the first dielectric layer 15 and the support layer 16 are formed above the peripheral area. Again, referring to FIG. 5 to FIG. 6, in some embodiments, the method further includes the following operations.

A capacitor structure 11 is formed on the storage area.

A capacitor covering layer 17 is formed, and covers an upper surface of the capacitor structure 11.

Specifically, the operation that a capacitor structure 11 is formed on the storage area includes the following sub-operations. Multiple discrete lower electrode layers 111 are formed on the substrate 10. The lower electrode layers 111 have cylindrical structures and are correspondingly connected to the multiple connection pads 102 one to one. A capacitor dielectric layer 112 is formed. The capacitor dielectric layer 112 at least covers surfaces of the lower electrode layers 111. An upper electrode layer 113 is formed. The upper electrode layer 113 covers a surface of the capacitor dielectric layer 112. An upper electrode filling layer 114 is formed. The upper electrode filling layer 114 is located on the upper electrode layer 113 and among the multiple discrete lower electrode layers 111. In an embodiment, the capacitor structure 11 is formed before the first dielectric layer 15 is formed.

As shown in FIG. 6, the capacitor covering layer 17 covers an upper surface of the upper electrode filling layer 114. In an embodiment, the material of the support layer 16 is same as the material of the capacitor covering layer 17. In a specific embodiment, the capacitor covering layer 17 and the support layer 16 are formed in a same process step. The second sub-layer 152 also covers the capacitor covering layer 17. In case there are multiple support layers 16, at least one support layer 16 and the capacitor covering layer 17 are formed in the same process step. Therefore, a process for manufacturing a semiconductor structure is simplified.

Continuously referring to FIG. 5, in an embodiment, the method further includes following operations. A bottom support layer 12, an intermediate support layer 13, and a top support layer 14 are successively formed above the peripheral area. The lower electrode layers 111 are formed in the bottom support layer 12, the intermediate support layer 13, and the top support layer 14. The bottom support layer 12, the intermediate support layer 13, and the top support layer 14 are configured to support the lower electrode layers 111.

Figure 8:
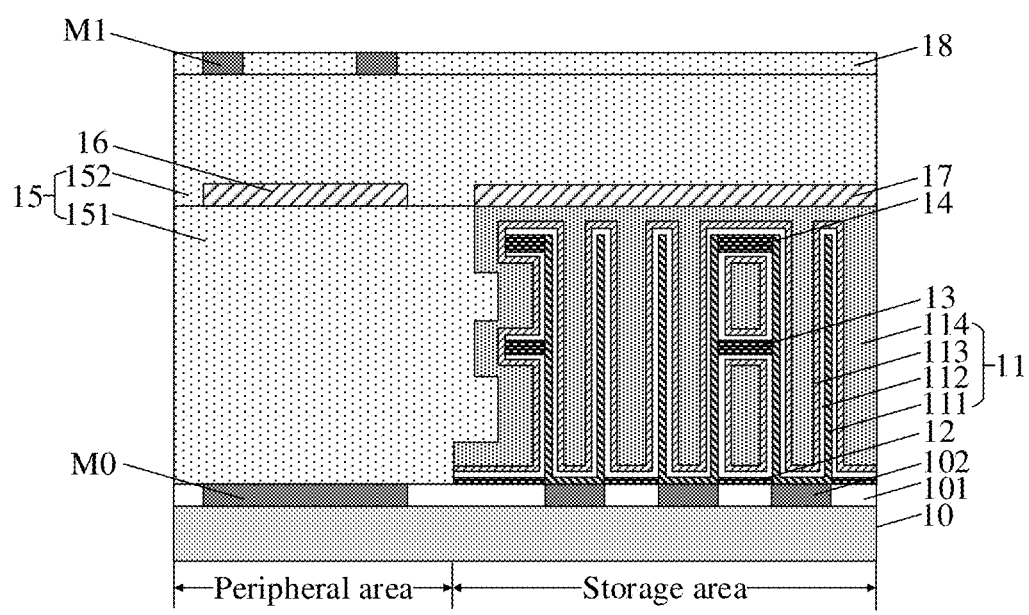
FIG. 8 is a process flow diagram of a semiconductor structure according to embodiments of the disclosure.
Figure 9:
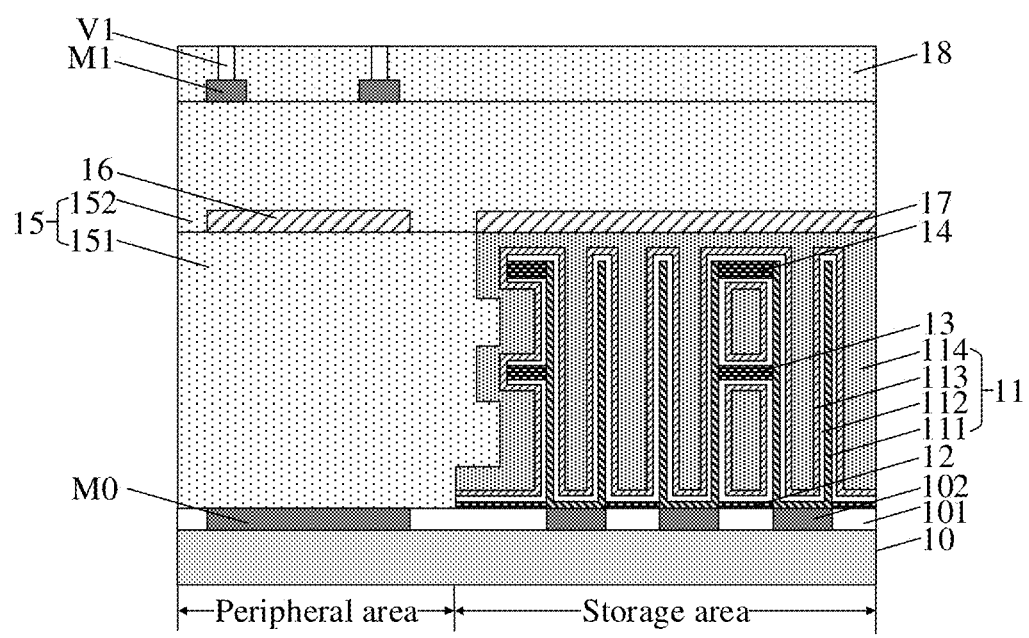
FIG. 9 is a process flow diagram of a semiconductor structure according to embodiments of the disclosure.

Next, S303 is performed, as shown in FIG. 8 to FIG. 9, and FIG. 1. A pad structure 19 is formed on the first dielectric layer 15. The pad structure 19 is located above the support layer 16.

In an embodiment, the pad structure 19 is formed above the peripheral area. In some embodiments, projections of the pad structure 19 and the support layer 16 are overlapped in a direction perpendicular to the substrate 10, but are not limited thereto. The projection of the pad structure 19 in the direction perpendicular to the substrate 10 may alternatively fall into the projection of the support layer 16 in the direction perpendicular to the substrate 10.

Again, referring to FIG. 8 to FIG. 9, and FIG. 1, in an embodiment, the method further includes the following operation. A second dielectric layer 18 is formed on the first dielectric layer 15. The pad structure 19 is located in the second dielectric layer 18. In some embodiments, the second dielectric layer 18 is not a single layer structure, and is formed by multiple layers of insulation materials in multiple process steps.

Specifically, the operation that the pad structure 19 is formed includes following sub-operations. A top metal layer M4, at least one intermediate metal layer M1, M2, or M3 located under the top metal layer M4, and conductive plugs V1, V2, and V3 electrically connecting the at least one intermediate metal layer M1, M2, or M3 and the top metal layer M4 in sequence. The top metal layer M4 is plate-shaped. An upper surface of the top metal layer M4 is exposed outside the second dielectric layer 18. The intermediate metal layer M1, M2, or M3 is in an annular shape.

A process for manufacturing the pad structure 19 is described below in detail with reference to FIG. 8 to FIG. 9, and FIG. 1. To be clear, the manufacturing process described below is only an example, and other methods may also be used to form the pad structure 19.

First, as shown in FIG. 8, the second dielectric layer 18 is formed on the first dielectric layer 15. The second dielectric layer 18 is patterned, and the intermediate metal layer M1 is formed in the patterned second dielectric layer 18.

Next, as shown in FIG. 9, the second dielectric layer 18 covering the intermediate metal layer M1 is formed. A through-hole is formed in the second dielectric layer. A conductive material is formed in the through-hole to form a contact hole V1.

Then, the intermediate metal layers M2 and M3, the top metal layer M4, and the conductive plugs V2 and V3 electrically connecting the intermediate metal layers M2 and M3 and the top metal layer M4 in sequence are formed. Finally, a structure shown in FIG. 1 is formed. Methods for forming the intermediate metal layers M2 and M3 and the top metal layer M4 are same as a method for forming the intermediate metal layer M1. Methods for forming the conductive plugs V2 and V3 are the same as a method for forming the conductive plug V1.

Materials of the top metal layer, the intermediate metal layer, and the conductive plug include at least one of tungsten (W), copper (Cu), titanium (Ti), tantalum (Ta), titanium nitride (TiN), tantalum nitride (TaN), metal silicides, or metal alloys.

It is to be noted that, the number of the intermediate metal layers is not limited in FIG. 1 and FIG. 2. There may be more or less intermediate metal layers, such as 1, 2, or 4. The number of the conductive plugs between the two adjacent metal layers is not limited in FIG. 2. There may be more or less conductive plugs.

The semiconductor structure provided in the embodiments of the disclosure includes the support layer 16 located under the pad structure 19. The material of the support layer 16 has a larger strength relative to the material of the first dielectric layer 15. Therefore, the support layer 16 can enhance the stability of the semiconductor structure. In addition, the support layer 16 can relieve the stress generated during bonding, so that damages of the stress to the first dielectric layer 15 can be reduced or eliminated. Therefore, the performance of the semiconductor structure can be improved.

It is to be noted that, those skilled in the art can change the sequence of the above steps without departing from the protection scope of the disclosure. The above are only preferred embodiments of the disclosure, and are not used to limit the scope of protection of the disclosure. Any modifications, equivalent replacements and improvements and the like made within the spirit and principle of the disclosure shall be included within the scope of protection of the disclosure.

What is claimed is:

1. A semiconductor structure, comprising:
    a substrate;
    a first dielectric layer, located on the substrate;
    a second dielectric layer, located on the first dielectric layer, wherein the thickness of the first dielectric layer is greater than that of the second dielectric layer; and
    a pad structure, located on the first dielectric layer and in the second dielectric layer, the pad structure is exposed at a top surface of the second dielectric layer so as to directly bond with other structures; and
    wherein the first dielectric layer has at least one support layer; the pad structure is located above the support layer; and a material strength of the support layer is greater than a material strength of the first dielectric layer; and projections of the pad structure and the support layer are overlapped in a direction perpendicular to the substrate.

2. The semiconductor structure of claim 1, wherein a material of the support layer includes at least one of silicon germanium, polysilicon, tungsten, titanium, tantalum, tungsten nitride, titanium nitride, or tantalum nitride.

3. The semiconductor structure of claim 1, wherein the first dielectric layer comprises a first sub-layer and a second sub-layer located on the first sub-layer; and the support layer is formed between the first sub-layer and the second sub-layer.

4. The semiconductor structure of claim 1, wherein the substrate comprises a storage area and a peripheral area; and the first dielectric layer, the support layer, and the pad structure are located above the peripheral area.

5. The semiconductor structure of claim 4, further comprising:
    a capacitor structure, located above the storage area; and
    a capacitor covering layer, covering an upper surface of the capacitor structure.

6. The semiconductor structure of claim 5, wherein a material of the support layer is same as a material of the capacitor covering layer.

7. The semiconductor structure of claim 6, wherein the support layer and the capacitor covering layer are formed in a same process step.

8. The semiconductor structure of claim 1, wherein the pad structure comprises a top metal layer, and the top metal layer is plate-shaped.

9. The semiconductor structure of claim 8, wherein the pad structure further comprises at least one intermediate metal layer located under the top metal layer, and a conductive plug electrically connecting the at least one intermediate metal layer and the top metal layer in sequence; and wherein the intermediate metal layer is in an annular shape.

10. A method for manufacturing a semiconductor structure, comprising:
    providing a substrate;
    forming, on the substrate, a first dielectric layer and at least one support layer located in the first dielectric layer, wherein a material strength of the support layer is greater than a material strength of the first dielectric layer;
    forming a second dielectric layer on the first dielectric layer, wherein the thickness of the first dielectric layer is greater than that of the second dielectric layer; and
    forming a pad structure on the first dielectric layer,
    wherein the pad structure is located above the support layer and located in the second dielectric layer, the pad structure is exposed at a top surface of the second dielectric layer so as to directly bond with other structures; and
    wherein projections of the pad structure and the support layer are overlapped in a direction perpendicular to the substrate; and the semiconductor structure is bonded with other structures by using the pad structure.

11. The method of claim 10, wherein the first dielectric layer comprises a first sub-layer and a second sub-layer; and the forming, on the substrate, the first dielectric layer and the at least one support layer comprises:
    forming the first sub-layer on the substrate;
    forming the support layer on the first sub-layer; and
    forming the second sub-layer, wherein the second sub-layer covers the support layer and the first sub-layer.

12. The method of claim 10, wherein the substrate comprises a storage area and a peripheral area; and the first dielectric layer, the support layer, and the pad structure are formed above the peripheral area.

13. The method of claim 12, further comprising:
    forming a capacitor structure on the storage area; and
    forming a capacitor covering layer, wherein the capacitor covering layer covers an upper surface of the capacitor structure.

14. The method of claim 13, wherein the capacitor covering layer and the support layer are formed in a same process step.

15. The method of claim 10, wherein the forming a pad structure comprises: forming a top metal layer, at least one intermediate metal layer located under the top metal layer, and a conductive plug electrically connecting the at least one intermediate metal layer and the top metal layer in sequence, wherein the top metal layer is plate-shaped, an upper surface of the top metal layer is exposed outside the second dielectric layer, and the intermediate metal layer is in an annular shape.

* * * * *